(12) United States Patent
Werkman et al.

(10) Patent No.: US 12,366,809 B2
(45) Date of Patent: Jul. 22, 2025

(54) METHODS AND APPARATUS FOR CONTROLLING A LITHOGRAPHIC PROCESS

(71) Applicant: ASML NETHERLANDS B.V., Veldhoven (NL)

(72) Inventors: Roy Werkman, Eindhoven (NL); David Frans Simon Deckers, Turnhout (BE); Bijoy Rajasekharan, Eindhoven (NL); Ignacio Salvador Vazquez Rodarte, Eindhoven (NL); Sarathi Roy, Eindhoven (NL)

(73) Assignee: ASML NETHERLANDS B.V., Veldhoven (NL)

(*) Notice: Subject to any disclaimer, the term of this patent is extended or adjusted under 35 U.S.C. 154(b) by 943 days.

(21) Appl. No.: 17/424,991

(22) PCT Filed: Dec. 18, 2019

(86) PCT No.: PCT/EP2019/085974
§ 371 (c)(1),
(2) Date: Jul. 22, 2021

(87) PCT Pub. No.: WO2020/156738
PCT Pub. Date: Aug. 6, 2020

(65) Prior Publication Data
US 2022/0091514 A1 Mar. 24, 2022

(30) Foreign Application Priority Data

Jan. 29, 2019 (EP) .................................... 19154087
Jul. 31, 2019 (EP) .................................... 19189258
Aug. 21, 2019 (EP) .................................... 19192740

(51) Int. Cl.
G03F 7/20 (2006.01)
G03F 7/00 (2006.01)
G05B 13/02 (2006.01)

(52) U.S. Cl.
CPC .......... G03F 7/705 (2013.01); G03F 7/70525 (2013.01); G05B 13/0265 (2013.01)

(58) Field of Classification Search
None
See application file for complete search history.

(56) References Cited

U.S. PATENT DOCUMENTS

2006/0033921 A1 2/2006 Den Boef et al.
2010/0112467 A1 5/2010 Chung
(Continued)

FOREIGN PATENT DOCUMENTS

KR 2017-0048540 5/2017
KR 2017-0077214 7/2017
(Continued)

OTHER PUBLICATIONS

Research Disclosure, "Robust Overlay Control Strategy", Kenneth Mason Publications, vol. 645, No. 44 (Jan. 2018) (Year: 2018).*
(Continued)

*Primary Examiner* — Tuan S Nguyen
(74) *Attorney, Agent, or Firm* — Pillsbury Winthrop Shaw Pittman, LLP

(57) ABSTRACT

A method of determining a control parameter for a lithographic process is disclosed, the method includes: defining a substrate model for representing a process parameter fingerprint across a substrate, the substrate model being defined as a combination of basis functions including at least one basis function suitable for representing variation of the process parameter fingerprint between substrates and/or batches of substrates; receiving measurements of the process
(Continued)

parameter across at least one substrate; calculating substrate model parameters using the measurements and the basis functions; and determining the control parameter based on the substrate model parameters and the similarity of the at least one basis function to a process parameter fingerprint variation between substrates and/or batches of substrates.

20 Claims, 9 Drawing Sheets

(56) References Cited

U.S. PATENT DOCUMENTS

| | | | | |
|---|---|---|---|---|
| 2012/0008127 | A1* | 1/2012 | Tel | G06T 7/80 |
| | | | | 355/77 |
| 2012/0218533 | A1 | 8/2012 | Lyulina et al. | |
| 2016/0006225 | A1 | 1/2016 | Watkins | |
| 2016/0062252 | A1* | 3/2016 | Veeraraghavan | G03F 7/705 |
| | | | | 702/150 |
| 2017/0277045 | A1* | 9/2017 | Menger | G03F 9/7046 |
| 2018/0067900 | A1 | 3/2018 | Mos et al. | |
| 2019/0258178 | A1 | 8/2019 | Ten Berge et al. | |
| 2021/0374403 | A1* | 12/2021 | Yumiba | G06V 20/695 |

FOREIGN PATENT DOCUMENTS

| | | |
|---|---|---|
| TW | 201626475 | 7/2016 |
| TW | 201633018 | 9/2016 |
| TW | 201740220 | 11/2017 |
| TW | 201818146 | 5/2018 |
| WO | 2016091529 | 6/2016 |
| WO | 2018072980 | 4/2018 |

OTHER PUBLICATIONS

Office Action issued in corresponding Chinese Patent Application No. 201980090607, dated Jan. 8, 2024.
International Search Report and Written Opinion issued in corresponding PCT Patent Application No. PCT/EP2019/085974, dated Apr. 3, 2020.
Huang, C.Y. et al.: "Overlay Improvement by Zone Alignment Strategy", Proc. of SPIE, vol. 6922 (2008).
Research Disclosure, "Robust Overlay Control Strategy", Kenneth Mason Publications, vol. 645, No. 44 (Jan. 2018).
Taiwanese Office Action issued in corresponding Taiwanese Patent Application No. 109100543, dated Jul. 18, 2022.
Office Action issued in corresponding Korean Patent Application No. 10-2021-7024233, dated Apr. 26, 2023.

* cited by examiner

METHODS AND APPARATUS FOR CONTROLLING A LITHOGRAPHIC PROCESS

CROSS-REFERENCE TO RELATED APPLICATIONS

This application is the U.S. national phase entry of PCT Patent Application No. PCT/EP2019/085974 which was filed Dec. 18, 2019, claims the benefit of priority of European Patent Application No. 19154087.1 which was filed Jan. 29, 2019; European Patent Application No. 19189258.7 which was filed on Jul. 31, 2019, and European Patent Application No. 19192740.9 which was filed on Aug. 21, 2019, each of which is incorporated herein in its entirety by reference.

BACKGROUND

Field of the Invention

The invention relates to methods and an apparatus for controlling a lithographic process and to computer program products for implementing such methods and apparatus.

Related Art

A lithographic process is one in which a lithographic apparatus applies a desired pattern onto a substrate, usually onto a target portion of the substrate, after which various processing chemical and/or physical processing steps work through the pattern to create functional features of a complex product. The accurate placement of patterns on the substrate is a chief challenge for reducing the size of circuit components and other products that may be produced by lithography. In particular, the challenge of measuring accurately the features on a substrate which have already been laid down is a critical step in being able to position successive layers of features in superposition accurately enough to produce working devices with a high yield. So-called overlay should, in general, be achieved within a few tens of nanometers in today's sub-micron semiconductor devices, down to a few nanometers in the most critical layers.

Consequently, modern lithography apparatuses involve extensive measurement or 'mapping' operations prior to the step of actually exposing or otherwise patterning the substrate at a target location. In the following discussion, the substrate will be referred to for convenience as a "wafer", without implying any limitation to the types of substrate that may be processed using the invention. Advanced substrate models, for example alignment models, have been, and continue to be, developed to model and correct more accurately non-linear distortions of the wafer grid that are caused by processing steps and/or by the lithographic apparatus itself. The expression wafer grid is used to refer to a coordinate system that is formed by the (measured) alignment marks at the wafer. For example, a wafer grid is formed by the alignment marks in the scribe lanes of the wafer, that in the ideal case form an orthogonal grid.

Alignment, overlay or focus model parameters are calculated in order to fit a substrate model to measurements of structures on substrates. Overlay, focus and alignment error on production wafers as function of a position on the wafer can be described by means of these substrate models. These substrate models are used in automatic process control (APC) systems on a lot to lot (feedforward) basis to control lithographic processes (a lot being a batch of one or more substrates or wafers). However, often the measurement data used for establishing the substrate model comprises spatial content demonstrating a lot to lot fluctuation. Hence it is often observed that substrate model parameters based on the measurement data also demonstrate a lot to lot variation. Using the substrate model parameters in controlling the lithographic processes may then cause instability of the lithographic processes as corrections to the lithographic processes are then determined based on outdated substrate model parameter data (e.g. based on measurements associated with previous lots, which are not representative for subsequent lots, e.g. the subsequent lot being the lot under correction). A method for determining substrate model parameters configured to control lithographic processes in a robust and stable manner is hence needed.

BRIEF SUMMARY OF THE INVENTION

The inventors have recognized that control of the lithographic processes can be improved by reducing the impact of lot to lot, or substrate to substrate variations comprised within measurement data used in determining substrate model parameters, without undue increase in computational or measurement overhead.

The invention provides a method of determining a control parameter for a lithographic process, the method comprising: defining a substrate model for representing a process parameter fingerprint across a substrate, the substrate model being defined as a combination of basis functions including at least one basis function suitable for representing variation of the process parameter fingerprint between substrates and/or batches of substrates; receiving measurements of the process parameter across at least one substrate; calculating substrate model parameters using the measurements and the basis functions; and determining the control parameter based on the substrate model parameters and the similarity of the at least one basis function to a process parameter fingerprint variation between substrates and/or batches of substrates.

In a further aspect of the invention a method of modeling measurement data associated with a spatial distribution of values of a process parameter across a substrate being subject to a process is provided, the method comprising: obtaining the measurement data; transforming the measurement data to a frequency domain using a Fourier Transform operation; filtering the transformed measurement data using a spatial filter configured to at least partially remove spatial frequency components associated with known noise characteristics and/or limitations of a control facility of the process; transforming the filtered measurement data in the frequency domain to a spatial domain using an inverse Fourier Transform operation to obtain filtered measurement data; and modeling the filtered measurement data to provide input for the control facility of the process.

Further features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which:

FIG. 7A is a flow diagram illustrating application of an established method of applying fingerprint capture for control of a lithographic substrate process, while

DETAILED DESCRIPTION OF EXEMPLARY EMBODIMENTS

Figure 1:
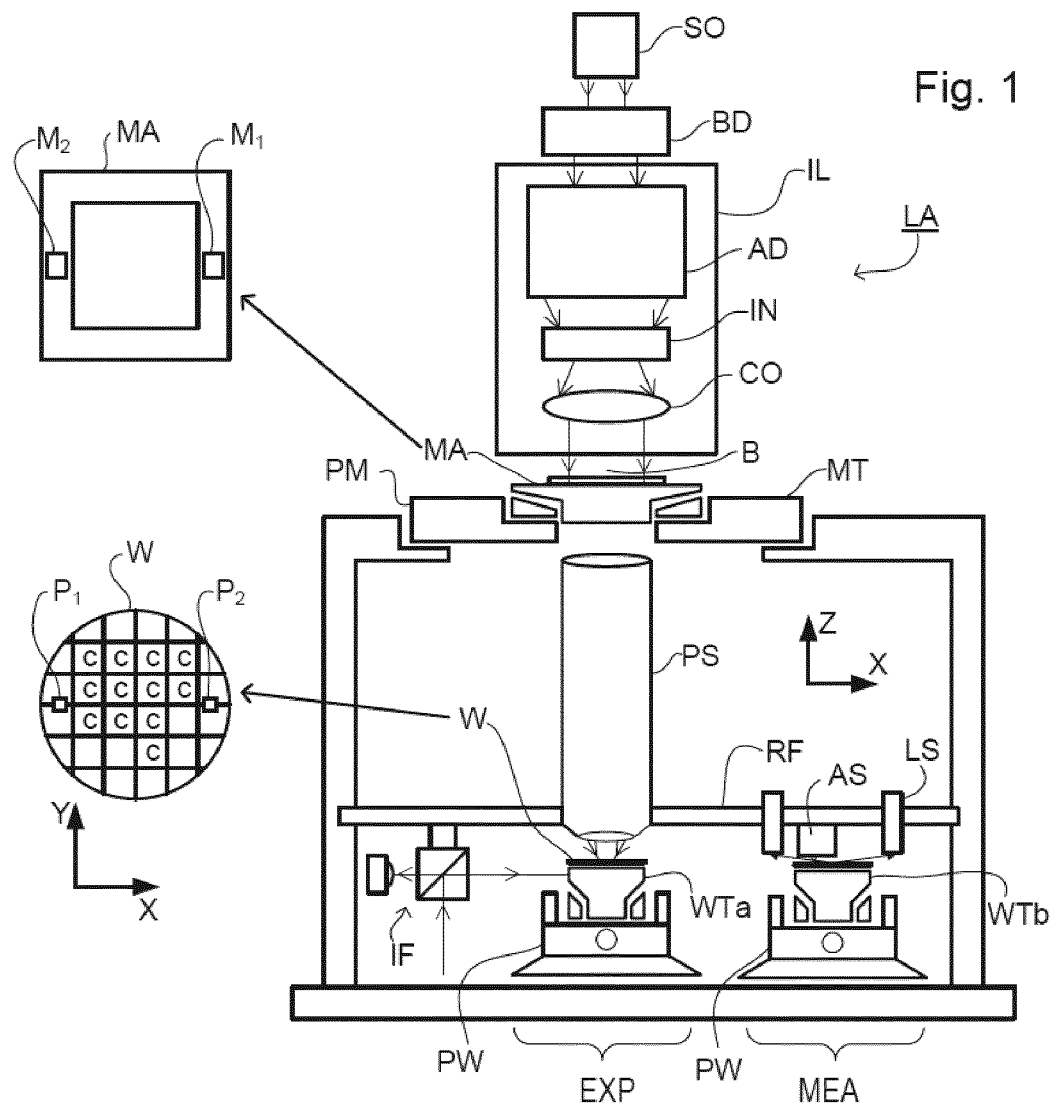
FIG. 1 depicts a lithographic apparatus according to an embodiment of the invention.

FIG. 1 schematically depicts a lithographic apparatus LA. The apparatus comprises:

- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WTa or WTb constructed to hold a substrate (e.g. a resist coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander.

In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as G-outer and G-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA in this example is of a so-called dual stage type which has two substrate tables WTa and WTb and two stations—an exposure station and a measurement station—between which the substrate tables can be exchanged. While one substrate on one substrate table is being exposed at the exposure station EXP, another substrate can be loaded onto the other substrate table at the measurement station MEA so that various preparatory steps may be carried out. The preparatory steps may include mapping the surface height of the substrate using a level sensor LS and measuring the position of alignment marks on the substrate using an alignment sensor AS. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus LA is to print product features at the correct locations with very high accuracy. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
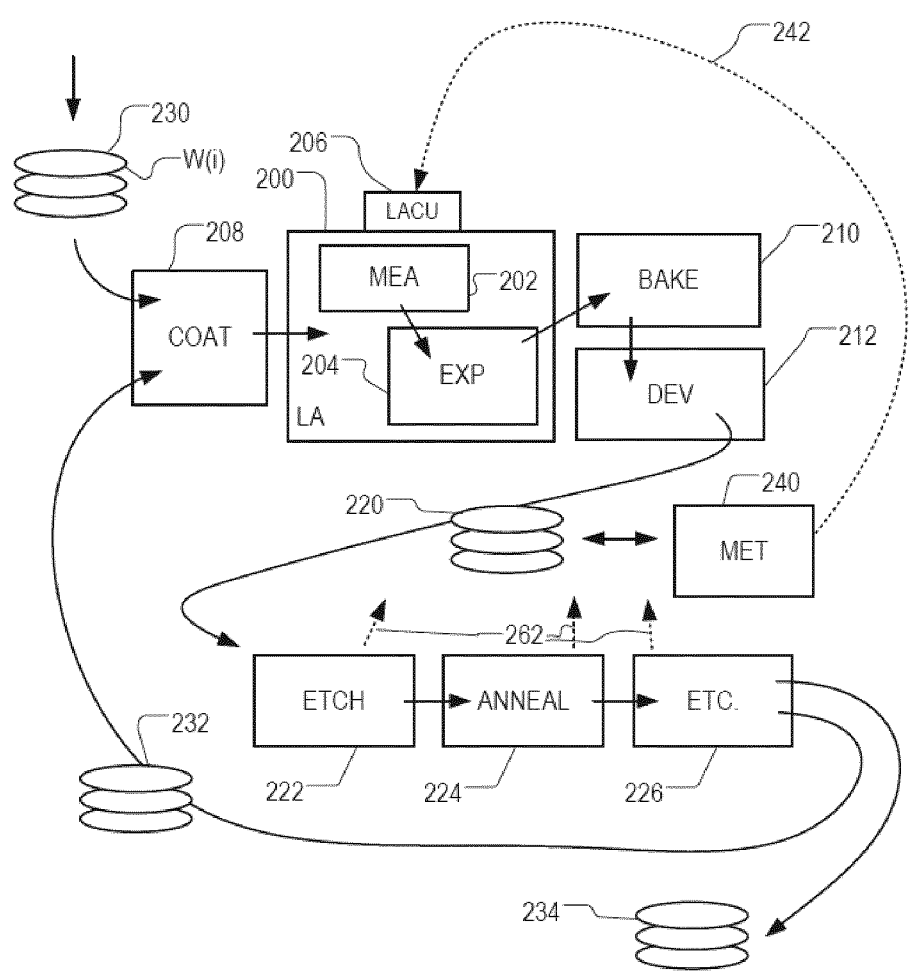
FIG. 2 shows schematically the use of the lithographic apparatus of FIG. 1 together with other apparatuses forming a production facility for semiconductor devices.

FIG. 2 at 200 shows the lithographic apparatus LA in the context of an industrial production facility for semiconductor products. Within the lithographic apparatus (or "litho tool" 200 for short), the measurement station MEA is shown at 202 and the exposure station EXP is shown at 204. The control unit LACU is shown at 206. Within the production facility, apparatus 200 forms part of a "litho cell" or "litho cluster" that contains also a coating apparatus 208 for applying photosensitive resist and other coatings to substrate W for patterning by the apparatus 200. At the output side of apparatus 200, a baking apparatus 210 and developing apparatus 212 are provided for developing the exposed pattern into a physical resist pattern.

Once the pattern has been applied and developed, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

Also shown in FIG. 2 is a metrology apparatus 240 which is provided for making measurements of parameters of the products at desired stages in the manufacturing process. A common example of a metrology station in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 can be used to maintain accurate performance of the patterning operations in the litho cluster, by control unit LACU 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

Figure 3:
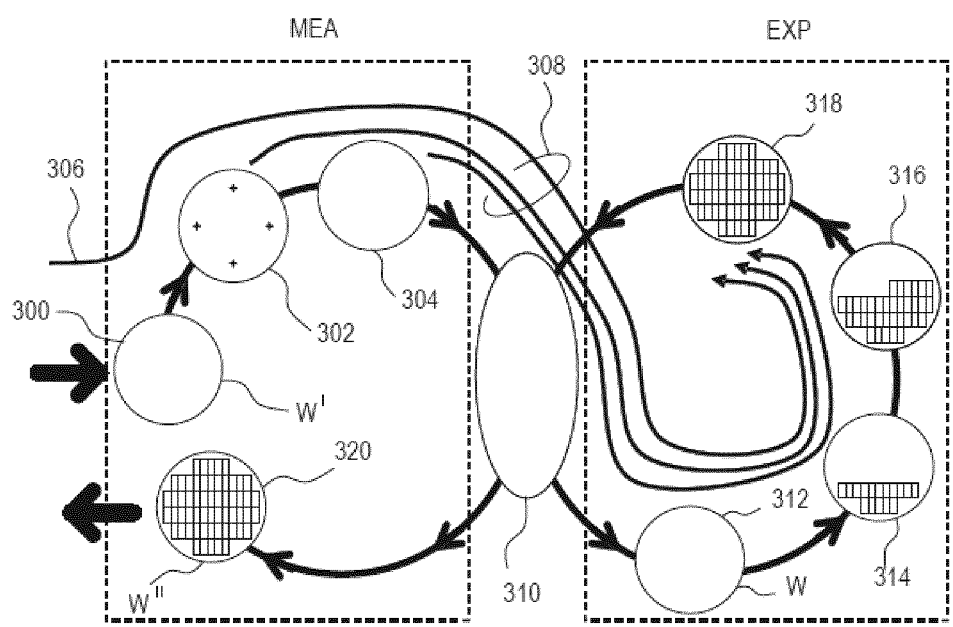
FIG. 3 illustrates schematically measurement and exposure processes in the apparatus of FIG. 1.

FIG. 3 illustrates the steps to expose target portions (e.g. die) on a substrate W in the dual stage apparatus of FIG. 1.

On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 300, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

At 302, alignment measurements using the substrate marks P1 etc. and sensors (not shown) are used to measure and record alignment of the substrate relative to substrate table WTa/WTb. In addition, several alignment marks across the substrate W' will be measured using alignment sensor AS. These measurements are used in one embodiment to establish a so-called wafer grid, which maps very accurately the spatial distribution of alignment marks across the substrate, including any distortion relative to a nominal rectangular grid. In other words, the measurements record positional deviations of points on the substrate, relative to their ideal location.

At step 304, a map of wafer height (Z) against X-Y position is measured also using the level sensor LS. The height map is used to achieve accurate focusing of the exposed pattern. Again, the measurements record positional deviations of points on the substrate in the Z direction, relative to an ideal (flat) substrate.

When substrate W' was loaded, recipe data 306 were received, defining the exposures to be performed, and also properties of the wafer and the patterns previously made and to be made upon it. Recipe data 306 may also include high-order alignment model parameters obtained from previous metrology measurements. To these recipe data are added the measurements of wafer position, wafer grid and height map that were made at 302, 304, so that a complete set of recipe data and measurement data 308 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are combined and interpolated to provide parameters of an alignment model. These parameters and the alignment model will be used during the exposure operation to correct positions of patterns applied in the current lithographic step. A conventional alignment model might comprise four, five or six parameters, together defining translation, rotation and scaling of the 'ideal' grid, in different dimensions. As described further in US 2013230797A1, advanced models are known that use more parameters.

In this regard, the present description refers primarily to so-called "interfield" substrate models, which describe positional deviations that are characteristic of locations across the substrate. In a real process, it is common also to model "intrafield" variations that are characteristic of locations within each field (target portion C). To determine the final position of applying a pattern, the interfield model and intrafield model can be combined in a well-known manner.

At 310, wafers W' and W are swapped, so that the measured substrate W' takes on the role of the substrate W, to be exposed as discussed previously, entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. The wafer W that has actually been exposed is removed and the relevant support will receive a new substrate (not shown) for being subjected to the measurements. Accordingly, once the tables have been swapped, determining the relative position between projection system PS and substrate table WTb (formerly WTa) is all that is necessary to make use of the measurement information 302, 304 for the substrate W (formerly W') in control of the exposure steps. At step 312, reticle alignment is performed using the mask alignment marks M1, M2. In steps 314, 316, 318, scanning motions and radiation pulses are applied at successive target locations across the substrate W, in order to complete the exposure of a number of patterns.

By using the alignment data and height map, as obtained at the measuring station, in the performance of the exposure steps, these patterns are accurately aligned with respect to the desired locations, and, in particular, with respect to features previously laid down on the same substrate. The exposed substrate, now labeled W" is unloaded from the apparatus at step 320, to undergo etching or other processes, in accordance with the exposed pattern.

Figure 4:
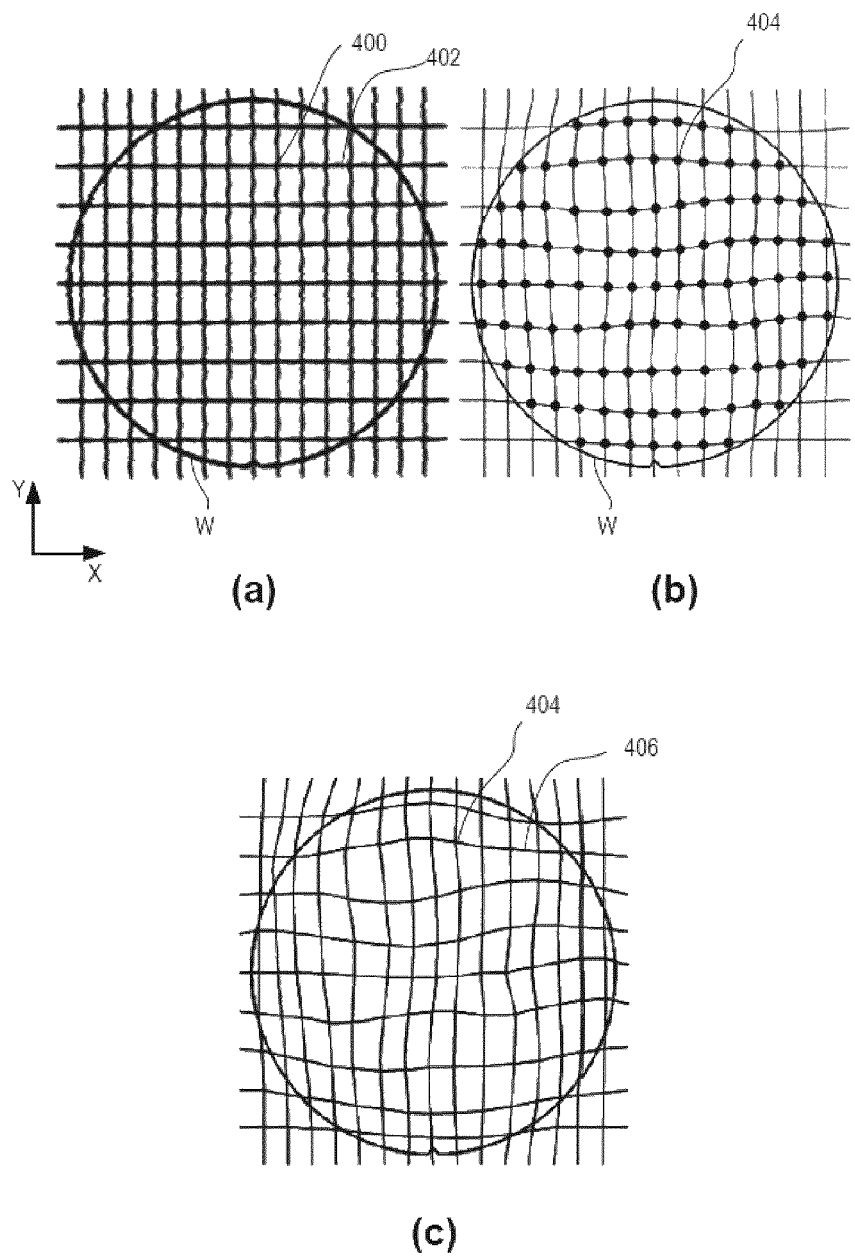
FIGS. 4A to 4C illustrate alignment information being used to correct for wafer grid distortion.

FIGS. 4A to 4C illustrate the form of alignment information that can be used to correct for wafer grid distortion as measured by the alignment sensor AL on alignment marks (targets) 400 in a previous layer on wafer (substrate) W. As shown in FIG. 4A, each target has a nominal position, defined usually in relation to a regular, rectangular grid 402 with axes X and Y. With reference to FIG. 4B, measurements of the real position 404 of each target reveal deviations from the nominal grid. The alignment marks may be provided within device areas of the substrate, and/or they may be provided in so-called "scribe lane" areas between device areas.

With reference to FIG. 4C, the measured positions 404 of all the targets can be processed numerically to set up a model of a distorted wafer grid 406 for this particular wafer. This alignment model is used in the patterning operation to control the position of the patterns applied to the substrate. In the example illustrated, the straight lines of the nominal grid have become curves. For such a case, a higher-order (advanced) alignment model can be used instead of with a linear alignment model. It goes without saying that the distortions illustrated are exaggerated compared to the real situation.

Even when advanced alignment models are used, errors inevitably remain in the overlay performance of the lithographic apparatus. An individual lithographic apparatus may also perform differently than other ones processing the same substrate. In order that the substrates that are exposed by the lithographic apparatus are exposed correctly and consistently, it is desirable to inspect exposed substrates to measure performance parameters such as overlay errors between subsequent layers, line thicknesses, critical dimensions (CD), focus (error) etc.

An inspection apparatus is therefore used to determine the properties of the substrates independently of the alignment sensors AS, and in particular, how the properties of different substrates or of different layers of the same substrate vary from layer to layer. The inspection apparatus (not shown in FIG. 3, but shown in FIG. 2 at 240) may be integrated into the lithographic apparatus LA or the lithocell LC or may be a stand-alone device. It may be a scatterometer, for example an angle-resolved scatterometer of the time described in published US patent application US2006033921A1.

The inspection apparatus can also be used in an advanced process control (APC) system to calibrate individual lithographic apparatus and to allow different tools to be used more interchangeably. Improvements to the apparatus's focus and overlay (layer-to-layer alignment) uniformity have recently been achieved by the implementation of a stability module, leading to an optimized process window for a given feature size and chip application, enabling the continuation the creation of smaller, more advanced chips. The stability module in one embodiment automatically resets the system to a pre-defined baseline at regular intervals, for example each day. More detail of lithography and metrology methods incorporating the stability module can be found in US2012008127A1. The known example implements three main process control loops. The first loop provides the local control of the lithography apparatus using the stability module and monitor wafers. The second (APC) loop is for local scanner control on-product (determining focus, dose, and overlay on product wafers).

The third control loop is to allow metrology integration into the second (APC) loop (e.g., for double patterning). All of these loops use measurements made by the inspection apparatus 240 in FIG. 2, in addition to the measurements made during the actual patterning operations of FIG. 3.

As mentioned above, standard alignment models may have six parameters (effectively three per direction X & Y) and in addition there are more advanced alignment models. On the other hand, for the most demanding processes currently in use and under development, to achieve the desired overlay performance requires more detailed corrections of the wafer grid. While standard models might use fewer than ten parameters, advanced alignment models typically use more than 15 parameters, or more than 30 parameters. Examples of advanced models are higher order wafer alignment (HOWA) models, zone-alignment (ZA) and radial basis function (RBF) based alignment models. HOWA is a published technique based on second, third and higher order polynomial functions. Zone alignment is described for example in Huang et al, "Overlay improvement by zone alignment strategy", Proc. SPIE 6922, 69221G (2008). RBF modeling is described in published US patent application 2012/0218533. The advanced models generate a complex description of the wafer grid that is corrected for, during the exposure of the target layer. RBF and latest versions of HOWA provide particularly complex descriptions based on tens of parameters. This implies a great many measurements are required to obtain a wafer grid with sufficient detail.

The alignment and overlay (substrate) models may model a positional deviation. The models are also applicable to other lithographic patterning characteristics such as, but not limited to, critical dimension (CD), focus and sidewall angle (SWA), because the substrate-edge-related disturbances for these characteristics have a similar root cause. Therefore the present disclosure makes reference to substrate models, which include alignment models, CD models, focus models and SWA models. Substrate models are used to model disturbances introduced in lithographic processing, and can represent the "fingerprint" or pattern of disturbance of a particular lithographic process or process step across a substrate. These disturbances include, but are not limited to alignment (positional deviations in the plane of the substrate), height deviations (normal to the plane), CD, focus and SWA.

In the proposed extended models, the interfield overlay disturbances may be described in terms of their radial & tangential (R&T) components as seen from the wafer center, rather than the traditional Cartesian (X&Y) orientations in which the measurements are delivered.

A semiconductor wafer is generally circular, although it may have a small flattened section or notch (seen in FIG. 4, for example) for alignment. If R is the distance from the center of the wafer to the edge and r is the distance of a point from the center of the wafer, then let t=R−r be the distance from the wafer edge for any given exposure field. More generally, the principles of the present disclosure may be applied in processing rectangular substrates, or other non-circular substrates. Depending on the substrate shape, and on the processing effects which are to be modeled, a different coordinate system may be adopted to express the distance from the substrate edge.

According to principles of the present disclosure, one or more specific edge-related basis functions are added to the interfield substrate model that are designed to be more capable of describing the edge effect. Substrate model parameters are thus calculated using a combination of basis functions, the basis functions including at least one edge basis function related to a substrate edge.

Let u(t) be the edge basis function (typically having units of nanometers). Various functions can be considered as suitable for use as edge basis functions related to a substrate edge. An exponential decay function may be defined:

$$u(t)=C \cdot 2^{-t/\lambda}$$

with $\lambda$ being a half-life decay distance or decay range parameter and C being the amplitude at the edge.

Another example is a rational function:

$$u(t)=C_1/t+C_2/t^2$$

with $C_1$ and $C_2$ being shape constants.

When using a rational function as a basis function, as in the second example above, care should be taken to avoid "divide-by-zero" errors. Using the simple formula above, u(t) will be infinity when "t" approaches zero. In a practical implementation, therefore, some modification of the formula is used to avoid excessive values, and to avoid computational error conditions. In one such implementation we use the terms of the form $C/(t+\delta)$ in place of $C/t$, where $\delta$ is a small offset effective to avoid dividing by zero at the wafer edge. (Alternatively, and equivalently, one can calculate t by reference to a radius R that is slightly larger than the true radius of the substrate.) Alternatively, one could apply a rule whereby the rational function is used only to values of "t" larger than a minimum value $\delta$ larger than zero. A variety of measures can be envisaged.

In another example, $\delta$ may be used as one of the variable parameters of the edge effect model. For example, a function $$u(t)=C_1/(t+\delta)$$

can be envisaged, with $C_1$ and $\delta$ in the role of shape constants.

It will be noted that these example edge basis functions are basis functions having one or more contributions expressed in terms of distance from the wafer edge, t. In the exponential decay functions, one or more terms have the distance from the edge as exponent. In the example rational functions, one or more terms have the distance from the edge in a denominator. These forms can be combined and/or other edge basis functions may be used. A feature of these examples is that their effect can be limited to an arbitrarily narrow edge area of the substrate, i.e., to a surface area of the substrate that is bounded by the substrate's perimeter and that has a radial width much smaller than the radius of the substrate. Accordingly, the edge basis functions enable to take into account the spatial dependence of a specific one of the disturbances related to only an area of the substrate near an edge of the substrate. In this way it does not disrupt the definition and fitting of the interfield model across the substrate as a whole. It will also be noted that each example introduces only two additional degrees of freedom to the model. Consequently the additional computational complexity is minimized, and the additional measurement burden is avoided.

Figure 5:
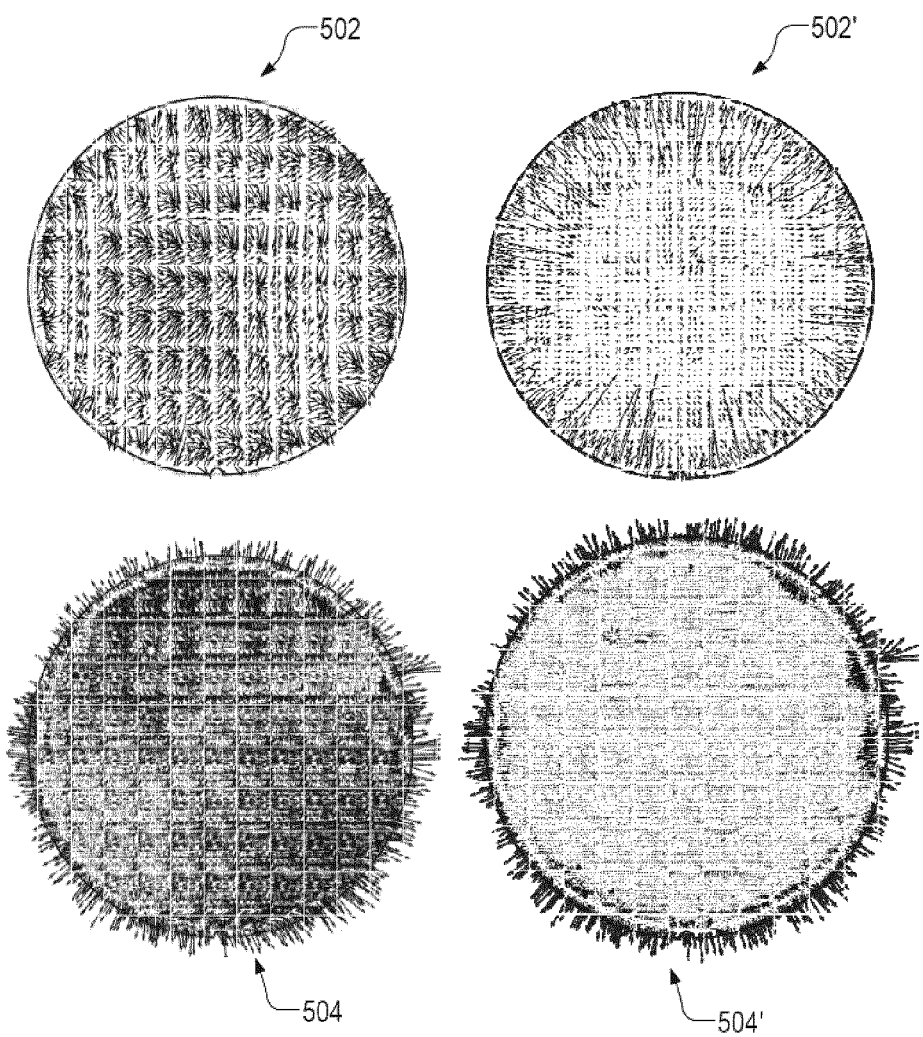
FIG. 5 illustrates examples of alignment errors and residuals for two example multi-wafer lots, with arrows indicating the direction of alignment errors.

The inventors have observed that, in some processes, the alignment and/or overlay error fingerprint demonstrate a significant variation between substrates and/or batches of substrates (e.g. lots). The same may hold for other process parameters like CD, focus or other derived process metrics (like Edge Placement Error). Often the lower order spatial content within the fingerprints shows a relatively large lot to lot variation, while higher order terms remain relatively stable. For example substrate model parameters associated with behavior of overlay, alignment or focus at the edge area of the substrates may vary considerably for certain processes introducing pronounced edge effects of overlay, alignment or focus parameters. For example the overlay error may radically increase in magnitude towards the edge of the wafer for a first substrate, while for a second substrate the magnitude may be less pronounced, or even opposite in sign. FIG. 5 shows plots 502 and 504 of uncorrected overlay errors in two different example products. The arrows indicate the direction of alignment errors. The direction of error may be either inwards or outwards, depending on the root cause and/or measurement convention (e.g. upper layer to lower layer alignment or vice versa). The edge effect is clearly visible in FIG. 5.

The inventors have appreciated that current automatic process control (APC) systems will not be able to handle such edge fingerprint variations, therefore it will not adequately correct for these edge disturbances. As a consequence, the ability to improve yield of edge dies using APC systems is adversely affected by this edge effect.

A simple solution would be to leave out basis functions of the substrate model being sensitive to variations comprised within the measurement data. However, when removing basis functions from the substrate model before fitting the measurement data there is a risk that the variation within the measurement data will affect the determination of the substrate model parameters associated with the remaining basis functions due to cross-talk effects. The variation within the measurement data may influence the values of the remaining substrate model parameters in an unpredictable manner in this case (where one or more base functions which would have picked up the variation are deliberately kept out of the fitting algorithm).

It is hence proposed to define a substrate model configured to represent the measurement data, including at least a part of the process parameter variation fingerprint(s). The substrate model is used to determine substrate model parameters describing the measurement data used in fitting the substrate model. It is only after determination of the substrate model parameters that selective modification of their use in controlling the lithographic process is applied based on their (determined, assumed or predicted) similarity to substrate to substrate or lot to lot (a lot is a batch of substrates) variations of fingerprints comprised within the measurement data. In this way no process parameter fingerprint variation information is transferred to the substrate model parameters used for controlling the lithographic process; the measurement data is fitted to basis functions, including at least one basis function sharing similarity to process parameter fingerprint variations (for example an exponential radial basis function suitable to represent edge fingerprint variations of an overlay parameter). The at least one basis function 'absorbs' the substrate to substrate or lot to lot fingerprint variations reducing the amount of variation observed in the further substrate model parameters utilized for controlling the lithographic process. Hence the lithographic process may now be controlled based on more stable substrate model parameters (e.g. the substrate model parameters for example excluding the substrate model parameters associated with basis functions being similar to process parameter fingerprint variations).

The modification may involve removal operations, e.g. nulling substrate model parameters comprising variation content before subsequent use in controlling the lithographic process. A control parameter for the lithographic process may then be determined exclusively based on substrate model parameters associated with basis functions which are not similar to process parameter fingerprint variations.

Alternatively the modification may involve weighting of substrate model parameters based on the similarity of their associated base functions to lot to lot or substrate to substrate variations of the process parameter fingerprint. The control parameter may then be a weighted function of the substrate model parameters.

Alternatively the modification may involve associating different smoothing factors associated with the exponentially weighted moving average, EWMA, filter functionality of an APC control framework to individual substrate model parameters based on their similarity to measurement data variation content. For example substrate model parameters associated with base functions picking up fluctuating edge variations may be smoothened more (e.g. a larger smoothing factor lambda is chosen) by averaging them across more lots of substrates compared to substrate model parameters being insensitive to edge fingerprint fluctuations.

While for controlling the lithographic process only stable substrate model parameters are used, for monitoring the lithographic process all substrate model parameters are still available and hence may be used for monitoring purposes.

Additionally substrate model parameters may be determined and subsequently be correlated to context information associated with the measurement data. For example a substrate model parameter describing an edge fingerprint variation of a process parameter like overlay may be correlated to a certain lithographic process property (e.g. a specific device used in the processing or specific settings of the lithographic process). By correlating substrate model parameters to context information a context to substrate model parameter (prediction) model may be defined, which allows determination of correction information used in correction of process parameters associated with to be exposed substrates (for which context information is at least partially available).

The modification of substrate model parameters may be done automatically using a learning model keeping track of evolution of measurement data and determining adequate modification of substrate model parameters to achieve stable control of the lithographic process.

In an embodiment a method of determining a control parameter for a lithographic process is disclosed, the method comprising: defining a substrate model for representing a process parameter fingerprint across a substrate, the substrate model being defined as a combination of basis functions including at least one basis function suitable for representing variation of the process parameter between substrates and/or batches of substrates; receiving measurements of the process parameter across at least one substrate; calculating substrate model parameters using the measurements and the combination of basis functions; and determining the control parameter based on the substrate model parameters and the similarity of the at least one basis function to a process parameter fingerprint variation between substrates and/or batches of substrates.

In a further embodiment the at least one basis function is suitable to represent an edge fingerprint variation between substrates and/or batches of substrates.

In a further embodiment the basis functions are polynomials.

In a further embodiment the polynomials are Zernike polynomials.

In a further embodiment the control parameters is a weighted function of the substrate model parameters, wherein the weights are based on the similarity of the basis functions associated with the substrate model parameters to process parameter fingerprint variations between substrates and/or batches of substrates.

In a further embodiment the weight of a substrate model parameter associated with a basis function being similar to a process parameter fingerprint variations between substrates and/or batches of substrates is nulled.

In a further embodiment the control parameter is an APC parameter, for example a smoothing parameter associated with an exponentially weighted moving average, EWMA, filter comprised within a model utilized in the automated process control (APC) strategy.

In a further embodiment the control parameter is a wafer level control (WLC) parameter configured to control a lithographic apparatus on a per substrate basis.

In a further embodiment individual substrate model parameters are correlated to context information associated with the substrates used for providing the measurement data.

In a further embodiment the weights associated with the substrate model parameters are updated by using a learning model keeping track of evolution of measurement data and determining adequate modification of substrate model parameter weights to achieve stable control of the lithographic process.

Figure 6:
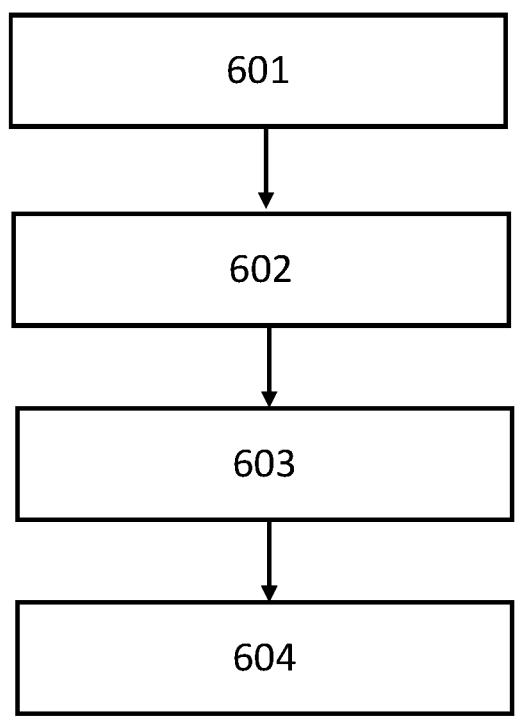
FIG. 6 is a flow diagram illustrating the method steps in accordance with embodiments of the invention.

FIG. 6 is a flow diagram showing the method steps as performed by some embodiments of the invention for determining a control parameter for a lithographic process. At step 601 a substrate model for representing a process parameter fingerprint across a substrate is obtained. As explained above, the substrate model is defined as a combination of basis functions including at least one basis function suitable for representing variation of the process parameter fingerprint between substrates and/or batches of substrates (lots). At step 602 measurements are received of the process parameter across at least one substrate. At step 603 the model is used to determine substrate model parameters using the measurements and the basis functions. At step 604 the control parameter is determined based on the substrate model parameters. In some embodiments the determination may be based on a similarity of the at least one basis function to a process parameter fingerprint variation between substrates and/or batches of substrates. For example the at least one basis function may be a function describing an edge effect. In some embodiments the determination may be based on weighted values of the substrate model parameters. The values of substrate model parameters associated with the at least one basis function have a reduced weighting.

Figure 7A:
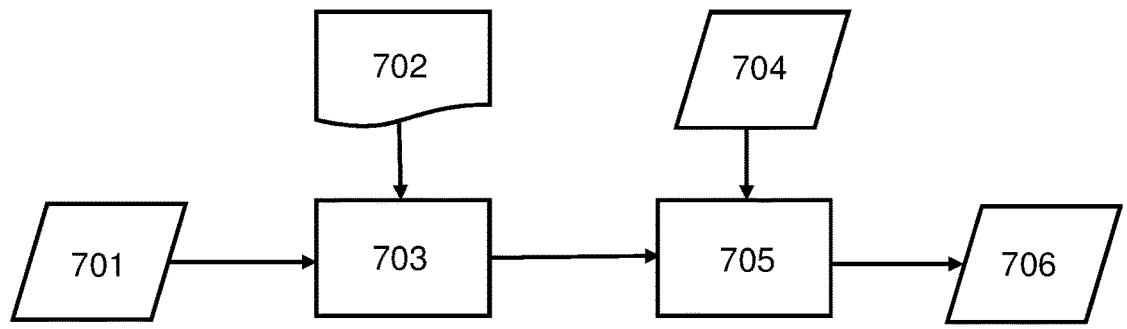

FIG. 7A is a flow diagram illustrating how parameter fingerprint capture may currently be applied to lithographic processing of wafers or batches of wafers (lots). At step 701 measurement data is obtained for a first wafer/lot (lot 1). For example the measurement data for lot 1 may comprise overlay data. At step 702 a substrate model for representing a process parameter fingerprint across the wafer/substrate is invoked. At step 703 the model is used to fit the data obtained for lot 1. The model thereby provides an estimation of the parameter fingerprint which may be used, for example, in the exposure corrections of the substrate(s) of lot 2 and subsequent lots. However, the fingerprint may also be used as a control parameter to help set the exposure corrections for lot 1 itself (so-called "rework"). This is shown at step 704 where measurement data for lot 2 is input to the model, and at step 705, in which the parameters obtained from the model estimation of lot 1 are applied to lot 2. Finally, at step 706 the residuals for lot 2 are output. The residuals may be used in order to make rework decisions, for example for determining exposure corrections for a lot of wafers. Residuals may be used in statistical process control (SPC), for example for monitoring SPC trends. A process may be controlled, for example through exposure corrections, to obtain residuals below a predetermined threshold. The threshold value may be application-specific and determined based on the requirements of a particular substrate.

Figure 7B:
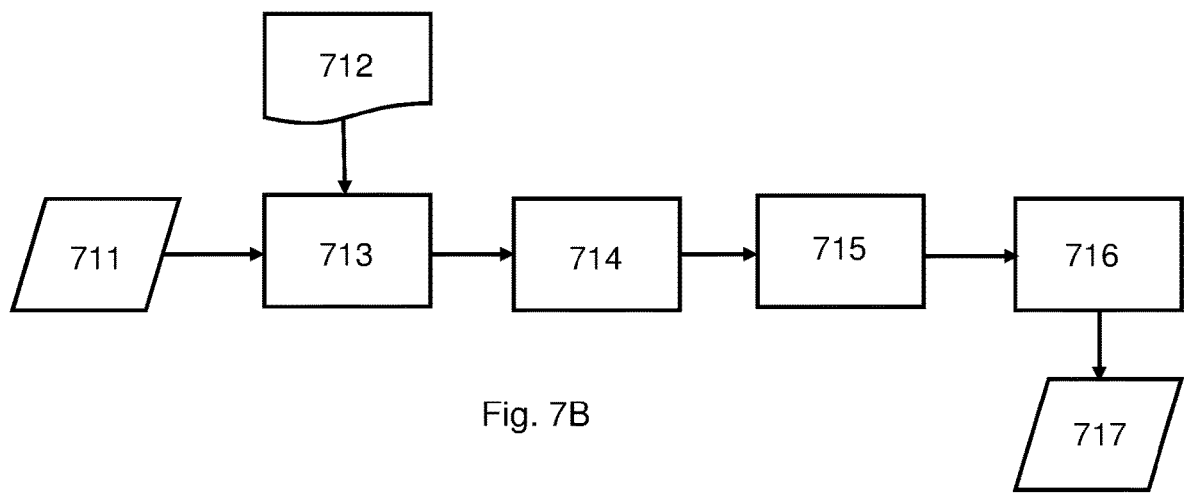
FIG. 7B is a flow diagram illustrating a corresponding method in accordance with an embodiment of the invention.

FIG. 7B is a flow diagram illustrating how parameter fingerprint capture may be applied in accordance with an embodiment of the invention. At step 711, as for step 701 in the method of FIG. 7A, measurement data is obtained for a first wafer/lot (lot 1). Steps 712 and 713 are also essentially the same as steps 702 and 703 of FIG. 7A. Note that the modelling at this point preferably includes all the basis functions that are found to provide a best estimation of the parameter fingerprint for the substrates at this stage of the lithographic process. At step 714 a revised or modified parameter fingerprint is determined by removing or stripping out those parts of the parameter estimation that are known to, or have been predetermined to, produce "noise" that distorts a parameter fingerprint when this is used as a control parameter (i.e. for processing of the next lot, lot 2, rather than for subsequent processing of lot 1). In a control situation implementation, steps 715 to 717 relate to lot 2. In step 715 lot 2 may be exposed with the parameters using the modified parameter fingerprint determined in step 714, in which noise effects may have been removed. This modified parameter fingerprint may also be referred to as a control parameter fingerprint. In step 716 lot 2 may be measured. The lot 2 measurements and control parameter fingerprint may then be used to determine lot 2 residuals in step 717. It is possible to perform a method of parameter fingerprint capture without considering and/or removing noise effects, i.e., skipping step 714. However, such a method may result in a disturbed fit for other parameters across the substrate.

Table 1 below provides overlay measurement data in the processing of wafers, in which three methods of determining the control parameter fingerprints are compared. The data shown include overlay measurement OvX and OvY in nanometers for the orthogonal x and y directions across the substrate. The data are the results of a statistical analysis from a large number of measurements made on the substrates, and include, for both the x and y directions: the values for which 99.7% of the data are lower (99.7); the maximum values (Max); the values corresponding to the mean+3 standard deviations above the mean (m+3sd) and the magnitude of 3 standard deviations (3sd). In an example implementation data consisting of the mean plus three standard deviations above the mean (m+3sd) values may be used for estimating control parameters. The measurement data for Lot 1 is shown, and this has been used by the substrate model to estimate control parameters, which have then been applied to the processing of Lot 2 by each of the three methods. In Method 1 the model has been applied without using any exponential edge model (basis function) to account for effects close to the edges of the substrate. In Method 2 the model has been applied with the exponential edge model and the full parameter fingerprint applied for the processing of Lot 2. In Method 3 the exponential edge model has been applied in the estimation of the parameter fingerprint, but the effect of the edge model has been removed for the purpose of applying the control parameter fingerprint in the processing of Lot 2. Note that the control parameter fingerprints of Method 1 and Method 3 are not the same because using the exponential edge modelling in the full parameter fingerprint estimation affects how other parts of the model (i.e. other basis functions) behave in determining the parameter estimation. Subsequently removing the effects of the exponential edge model in Method 3 does not result in the same parameter fingerprint as not using the exponential edge model in the initial model estimation, as in Method 1.

TABLE 1

|  |  | OvX nm | OvY nm |
|---|---|---|---|
| Lot 1 | 99.7 | 4.72 | 3.19 |
|  | Max | 6.60 | 3.89 |
|  | m + 3 s | 2.68 | 2.05 |
|  | 3 sd | 2.64 | 2.02 |
| Lot 2 Method 1 | 99.7 | 5.27 | 6.79 |
|  | Max | 16.27 | 10.48 |
|  | m + 3 s | 3.47 | 3.48 |
|  | 3 sd | 3.30 | 3.21 |
| Lot 2 Method 2 | 99.7 | 5.20 | 7.59 |
|  | Max | 16.39 | 10.38 |
|  | m + 3 s | 3.54 | 3.70 |
|  | 3 sd | 3.36 | 3.44 |
| Lot 2 Method 3 | 99.7 | 5.19 | 5.61 |
|  | Max | 16.45 | 10.26 |
|  | m + 3 s | 3.28 | 2.91 |
|  | 3 sd | 3.10 | 2.64 |

Table 1 shows that when there is an exponential edge model used to fit the data for lot 1, and the resulting unmodified control parameter fingerprint is used for lot 2 this results in an increase in the mean+3 standard deviations (m+3s) overlay values OvX and OvY for lot 2 (Model 2), compared with when no exponential edge model is used (Model 1)—3.54 nm and 3.70 nm compared with 3.47 nm and 3.48 nm. However, when Model 3 is used, in which the noise effects of the exponential edge model are removed after the initial model estimation, the overlay values are lowest—3.28 and 2.91.

Figure 8:
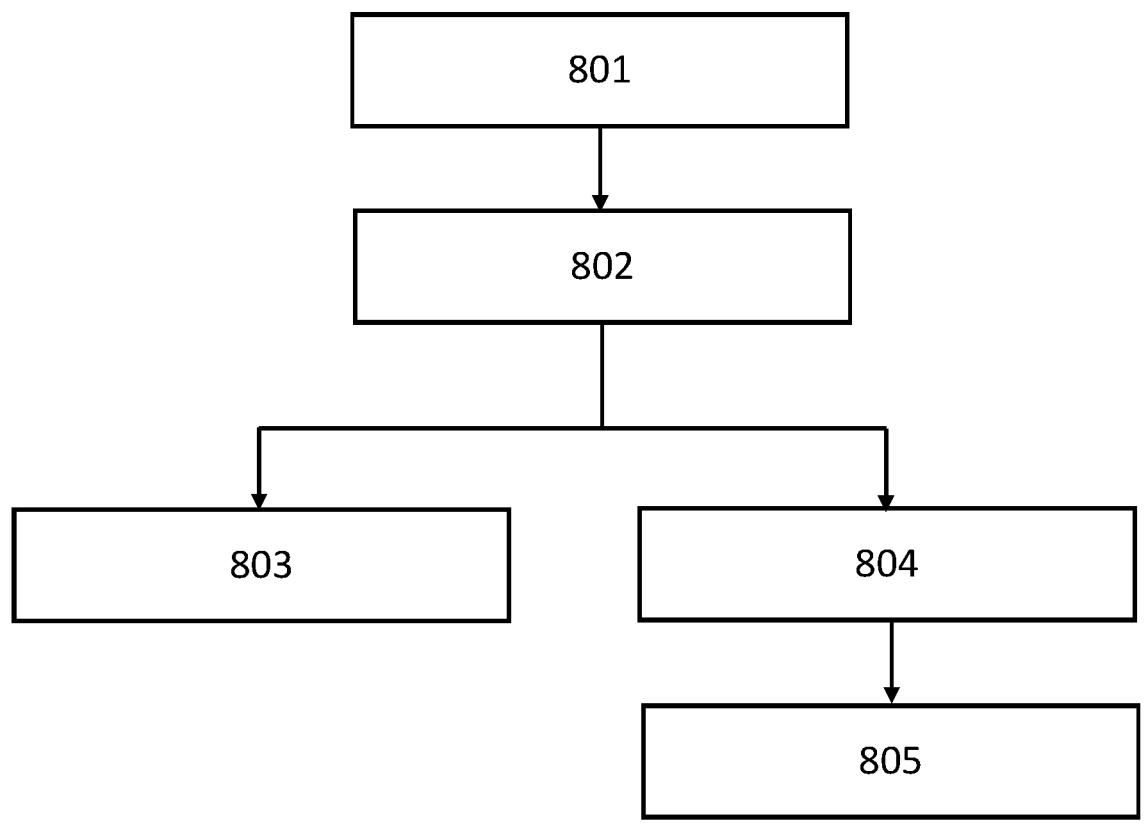
FIG. 8 is a flow diagram illustrating the method steps applied in a lithographic processing method according to the invention.

FIG. 8 is a flow diagram illustrating application of a method of parameter fingerprint capture applied to lithographic processing of wafers or batches of wafers, utilising a model to determine operational parameters, including at least one control parameter. The lithographic process involves a plurality of processing steps performed on a series of substrates. At 801, after a first step in the process, measurements are obtained of a measurement parameter across a substrate. At 802 the measurements provided as input to the model to determine a full fingerprint estimation of the operational parameters across the substrate. At this stage preferably all basis functions that are found to provide an optimum estimation of the parameter fingerprint are used in the model. At 803 the full fingerprint estimation is used for applying the operational parameters at a second processing step of the substrate. Also, at 804, the full fingerprint estimation is modified to account for effects predetermined to have a distorting effect on the at least one control parameter, thereby obtaining a control parameter fingerprint estimation for the substrate. At 805, for the first step of the lithographic process, the control parameter fingerprint estimation is applied in the processing of a subsequent substrate in the series of substrates.

A further use of the per wafer, or per lot fit results may be used to obtain a per-context fingerprint. Context data is data that relates to a product unit and/or processes affecting the product unit. For example context data may comprise data relating to a lithographic apparatus LA, e.g. apparatus ID, apparatus parameters. Context data may also comprise metrology data relating to a process for patterning the product unit performed by an apparatus, for example temperature, pressure, time/date input data was obtained. The context data may hold some information not present in the distributional data and can help prediction. For example, each apparatus and chuck may have a unique fingerprint which effects the multidimensional data. Knowing that a wafer is exposed on a specific apparatus or chuck, for example, may help the model to better capture the parameter of interest. The context data may correlate to a pre-defined structure present on a patterned substrate, for example as a result of using a particular chuck or apparatus for patterning a substrate. For example, product units patterned using a first chuck may be have different properties to a product unit patterned using a second chuck. Prediction of an object structure on a product unit, correlating to the pre-defined structure, may be based on provided context data. For example, the context variables may be added as part of a feedforward aspect of the lithographic processing.

The per-context fingerprint determination may be performed over lots leading to optimal fingerprint decomposition over context variables, which can be used, for example, for per context control (either on the specific lithographic processing equipment, e.g. etcher, or on the scanner).

The measurement data may further be filtered before any subsequent modeling takes place. Often noise components are present within the measurement data that may compromise control actions targeted to improve the process based on modeled measurement data. To prevent the noise to affect the modeling and/or control negatively it is proposed to remove periodic content within the measurement data having a spatial frequency above a certain threshold. The threshold value may for example be based on process control capabilities in case these do not extend to spatial frequencies higher than said threshold. In an embodiment measurement data relating to a spatial fingerprint of performance data is obtained, the spatial fingerprint is transformed to the frequency domain (Fourier Transform) where a frequency filter (for example a low pas filter) is applied. The filtered data is transformed subsequently to the spatial domain by applying an inverse Fourier Transform to the filtered data. The filtered measurement data is modeled and serves as input for process control action, for example APC control.

The filter parameters (cut off frequencies, functional expression of the frequency filter) may be based on learning methods, for example based on comparing e-beam metrology data (Scanning Electron beam Microscope, SEM) with the measurement data of interest (typically based on scatterometry data, such as overlay, focus or Critical Dimension (CD) data).

In an embodiment measurement data, such as overlay, focus or CD data, is obtained.

Subsequently the measurement data is processed using a method of spatial filtering, wherein the parameters defining the filter used in the spatial filtering are based on process control capabilities and/or pre-knowledge on a spatial frequency characteristic of a noise component comprised within the measurement data.

In an embodiment the parameters defining the filter are based on a comparison between first measurement data obtained using a first metrology apparatus and second measurement data obtained using a second metrology apparatus.

In an embodiment the filtered measurement data is modeled using any method of modelling disclosed in this document.

In an embodiment the modeled filtered measurement data is used for process control purposes, for example controlling overlay, CD or focus of a lithographic apparatus.

Further embodiments of the invention are disclosed in the list of numbered clauses below:
1. A method of determining a control parameter for a lithographic process, the method comprising:
   obtaining a substrate model for representing a process parameter fingerprint across a substrate, the substrate model being defined as a combination of basis functions including at least one basis function suitable for representing variation of the process parameter fingerprint between substrates and/or batches of substrates;

receiving measurements of the process parameter across at least one substrate;

determining substrate model parameters using the measurements and the basis functions; and determining the control parameter based on the substrate model parameters and a similarity of the at least one basis function to a process parameter fingerprint variation between substrates and/or batches of substrates.

2. The method of clause 1, wherein the at least one basis function is suitable to represent an edge fingerprint variation between substrates and/or batches of substrates.

3. The method of clause 1 or 2, wherein the basis functions are polynomials, for example Zernike polynomials.

4. The method of any preceding clause, wherein the control parameter is a weighted function of the substrate model parameters, wherein the weights are based on the similarity of the basis functions associated with the substrate model parameters to process parameter fingerprint variations between substrates and/or batches of substrates.

5. The method of clause 4, wherein the weight of a substrate model parameter associated with a basis function exceeding a measure of similarity to a process parameter fingerprint variation between substrates and/or batches of substrates is nulled.

6. The method of any preceding clause, wherein the control parameter is an automatic process control, APC, model parameter, for example a smoothing parameter associated with an exponentially weighted moving average, EWMA, filter utilized in the APC model.

7. The method of clause 6, wherein the APC model comprises a plurality of smoothing parameters and at least two smoothing parameters out of said plurality of smoothing parameters have a different functional dependency to the substrate model parameters.

8. The method of clause 1 to 5, wherein the control parameter is a wafer level control, WLC, parameter configured to control a lithographic apparatus on a per substrate basis.

9. The method of any preceding clause, wherein individual substrate model parameters are correlated to context information associated with the substrates used for providing the measurement data.

10. The method of any preceding clause, further comprising keeping the control parameter up to date by using a learning model keeping track of evolution of measurement data and determining adequate modification of the control parameter to achieve stable control of the lithographic process.

11. A method of determining a control parameter for a lithographic process, the method comprising:

obtaining a substrate model for representing a process parameter fingerprint across a substrate, the substrate model being defined as a combination of basis functions including at least one basis function suitable for representing variation of the process parameter fingerprint between substrates and/or batches of substrates;

receiving measurements of the process parameter across at least one substrate;

determining substrate model parameters using the measurements and the basis functions; and determining the control parameter based on weighted values of the substrate model parameters, wherein values of substrate model parameters associated with the at least one basis function have a reduced weighting.

12. A method of utilising a model to determine operational parameters, including at least one control parameter, for a lithographic process involving a plurality of processing steps performed on a series of substrates, the method comprising:

after a first step in the process obtaining measurements of a measurement parameter across at least one substrate;

applying the measurements to the model to determine a full fingerprint estimation of the operational parameters across the substrate;

utilising the full fingerprint estimation for applying the operational parameters at a second processing step of the substrate;

modifying the full fingerprint estimation to account for effects predetermined to have a distorting effect on the at least one control parameter, thereby obtaining a control parameter fingerprint estimation for the substrate; and at said first step applying the control parameter fingerprint estimation in the processing of at least one subsequent substrate in the series of substrates.

13. The method of clause 12 wherein modifying the full fingerprint estimation to account for effects predetermined to have a distorting effect on the at least one control parameter is based on known fingerprint behaviour determined during a control strategy setup phase.

14. The method of clause 12 or clause 13 wherein the operational parameters used in the model are selected by tuning an exponentially weighted moving average, EWMA, filter to provide a half-life decay distance or decay range parameter, $\lambda$, value for each of the parameters.

15. The method of any preceding clause wherein the control parameter fingerprint estimation is used to determine a per-context fingerprint related to a specific apparatus employed in the lithographic process.

16. A computer program comprising instructions which, when executed on at least one processor, cause the at least one processor to carry out a method according to any of clauses 1 to 15.

17. An apparatus for determining a control parameter for a lithographic process, the apparatus comprising one or more processors configured to execute computer program code to undertake the method as set out in any of clauses 1 to 15.

18. A metrology apparatus comprising an apparatus according to clause 17.

19. An inspection apparatus comprising an apparatus according to clause 17.

20. A lithographic apparatus comprising an apparatus according to clause 17.

21. A method of modeling measurement data associated with a spatial distribution of values of a process parameter across a substrate being subject to a process, the method comprising:

obtaining the measurement data;

transforming the measurement data to a frequency domain using a Fourier Transform operation;

filtering the transformed measurement data using a spatial filter configured to at least partially remove spatial frequency components associated with known noise characteristics and/or limitations of a control facility of the process;

transforming the filtered measurement data in the frequency domain to a spatial domain using an inverse Fourier Transform operation to obtain filtered measurement data; and modeling the filtered measurement data to provide input for a control facility of the process.

The steps of the methods described above can be automated within any general purpose data processing hardware (computer), so long as it has access to the measurement data. The apparatus may be integrated with existing processors such as the lithography apparatus control unit LACU shown in FIG. 2 or an overall process control system. The hardware can be remote from the processing apparatus, even being located in a different country. Components of a suitable data processing apparatus (DPA) are shown in FIG. 6. The apparatus may be arranged for loading a computer program product comprising computer executable code. This may enable the computer assembly, when the computer program product is downloaded, to implement the functions of the PCA apparatus and/or RCA apparatus as described above.

Figure 9:
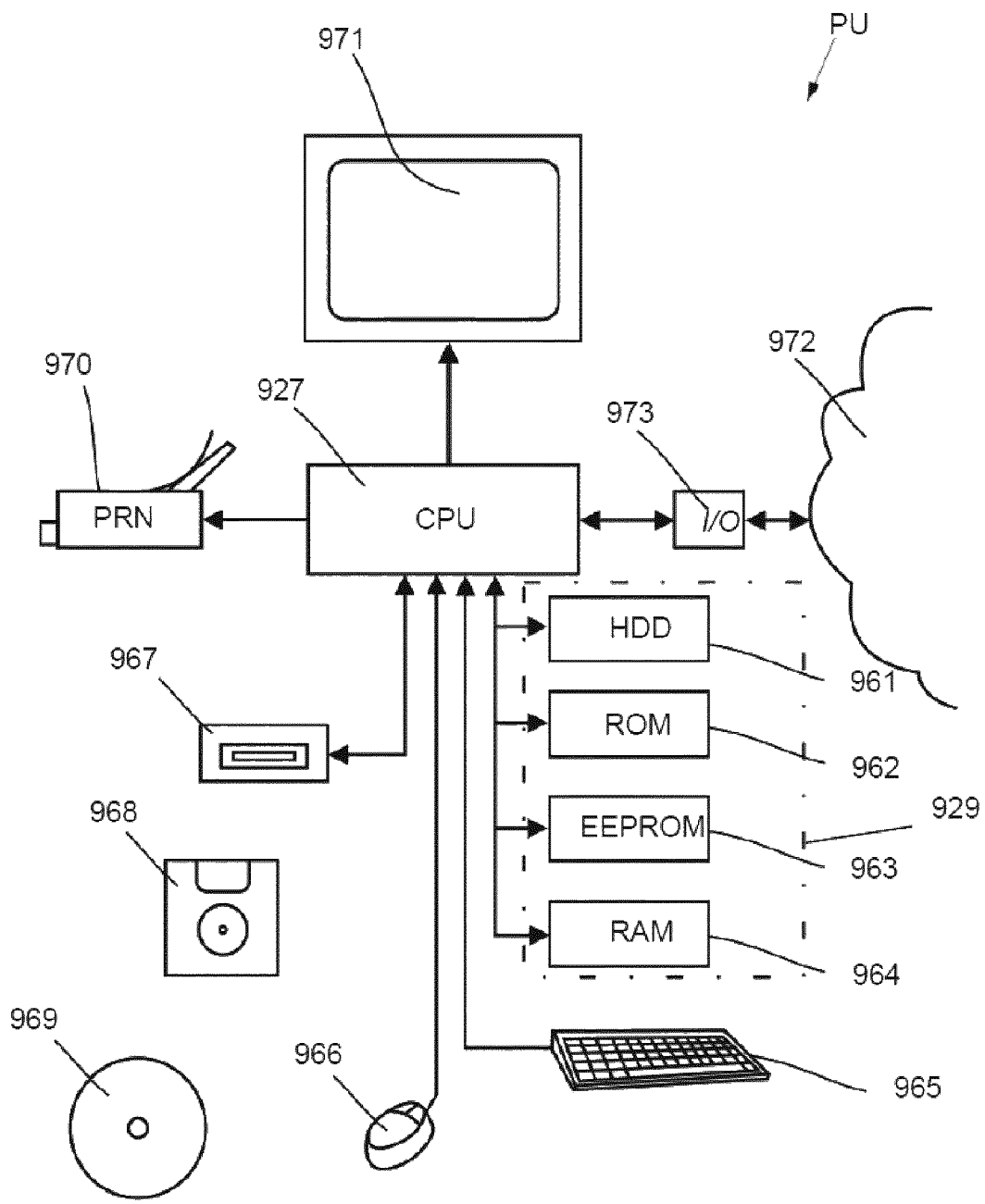
FIG. 9 illustrates schematically data processing hardware programmable to implement the apparatuses of the embodiments of the present invention.

With reference to FIG. 9, memory 929 connected to processor 927 may comprise a number of memory components like a hard disk 961, Read Only Memory (ROM) 962, Electrically Erasable Programmable Read Only Memory (EEPROM) 963 and Random Access Memory (RAM) 964.

Not all aforementioned memory components need to be present. Furthermore, it is not essential that aforementioned memory components are physically in close proximity to the processor 927 or to each other. They may be located at a distance away The processor 927 may also be connected to some kind of user interface, for instance a keyboard 965 or a mouse 966. A touch screen, track ball, speech converter or other interfaces that are known to persons skilled in the art may also be used.

The processor 927 may be connected to a reading unit 967, which is arranged to read data, e.g. in the form of computer executable code, from and under some circumstances store data on a data carrier, like a floppy disc 968 or a CDROM 969. Also DVD's or other data carriers known to persons skilled in the art may be used.

The processor 927 may also be connected to a printer 970 to print out output data on paper as well as to a display 971, for instance a monitor or LCD (Liquid Crystal Display), of any other type of display known to a person skilled in the art.

The processor 927 may be connected to a communications network 972, for instance a public switched telephone network (PSTN), a local area network (LAN), a wide area network (WAN) etc. by means of transmitters/receivers 973 responsible for input/output (I/O). The processor 927 may be arranged to communicate with other communication systems via the communications network 972. In an embodiment of the invention external computers (not shown), for instance personal computers of operators, can log into the processor 927 via the communications network 972.

The processor 927 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 927 may even be located a distance away of the other processing units and communicate via communications network 972. Connections between modules can be made wired or wireless.

The computer system can be any signal processing system with analogue and/or digital and/or software technology arranged to perform the functions discussed here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. As already mentioned, the invention may be applied in industrial processing applications quite separate from lithography. Examples might be in production of optical components, automotive manufacture, construction—any number of applications where object data exists in the form of measurements made with a certain spatial distribution over the product. As in the example of lithography. Although specific reference may have been made above to the use of embodiments of the invention in the context of optical lithography, it will be appreciated that the invention may be used in other types of lithography, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The descriptions above are intended to be illustrative, not limiting. Thus, it will be apparent to one skilled in the art that modifications may be made to the invention as described without departing from the spirit and scope of the claims appended hereto. In addition, it should be appreciated that structural features or method steps shown or described in any one embodiment herein can be used in other embodiments as well.

The invention claimed is:

1. A method comprising:
obtaining a substrate model for representing a process parameter fingerprint across a substrate, the substrate model being defined as a combination of basis functions including at least one basis function suitable for representing variation of the process parameter fingerprint between substrates and/or batches of substrates;
receiving measurements of the process parameter across at least one substrate;
determining substrate model parameters using the measurements and the basis functions; and
determining a control parameter based on the substrate model parameters and a similarity of the at least one basis function to a process parameter fingerprint variation between substrates and/or batches of substrates.

2. The method of claim 1, wherein the at least one basis function is suitable to represent an edge fingerprint variation between substrates and/or batches of substrates.

3. The method of claim 1, wherein the basis functions are polynomials.

4. The method of claim 1, wherein the control parameter is a weighted function of the substrate model parameters, wherein the weights are based on a similarity of the basis functions associated with the substrate model parameters to process parameter fingerprint variations between substrates and/or batches of substrates.

5. The method of claim 4, wherein the weight of a substrate model parameter associated with a basis function exceeding a measure of similarity to a process parameter fingerprint variation between substrates and/or batches of substrates is reduced or nulled.

6. The method of claim 1, wherein the control parameter is an automatic process control (APC) model parameter of an APC model.

7. The method of claim 6, wherein the APC model comprises a plurality of smoothing parameters and at least two smoothing parameters out of the plurality of smoothing parameters have a different functional dependency to the substrate model parameters.

8. The method of claim 1, wherein the control parameter is configured to control a lithographic apparatus on a per substrate basis.

9. The method of claim 1, wherein individual substrate model parameters are correlated to context information associated with the substrates used for providing the measurement data.

10. The method of claim 1, further comprising keeping the control parameter up to date by using a learning model keeping track of evolution of measurement data and determining adequate modification of the control parameter to achieve stable control of the lithographic process.

11. A computer product comprising a non-transitory computer-readable medium having instructions therein, the instructions, when executed by at least one processor, configured to cause the at least one processor to at least:
obtain a substrate model for representing a process parameter fingerprint across a substrate, the substrate model being defined as a combination of basis functions including at least one basis function suitable for representing variation of the process parameter fingerprint between substrates and/or batches of substrates;
receive measurements of the process parameter across at least one substrate;
determine substrate model parameters using the measurements and the basis functions; and
determine a control parameter based on the substrate model parameters and a similarity of the at least one basis function to a process parameter fingerprint variation between substrates and/or batches of substrates.

12. A method comprising:
obtaining a substrate model for representing a process parameter fingerprint across a substrate, the substrate model being defined as a combination of basis functions including at least one basis function suitable for representing variation of the process parameter fingerprint between substrates and/or batches of substrates;
receiving measurements of the process parameter across at least one substrate;
determining substrate model parameters using the measurements and the basis functions; and
determining a control parameter based on weighted values of the substrate model parameters, wherein values of substrate model parameters associated with the at least one basis function have a reduced weighting.

13. The method of claim 12, wherein the at least one basis function is suitable to represent an edge fingerprint variation between substrates and/or batches of substrates.

14. A computer product comprising a non-transitory computer-readable medium having instructions therein, the instructions, when executed by at least one processor, configured to cause the at least one processor to at least:
obtain a substrate model for representing a process parameter fingerprint across a substrate, the substrate model being defined as a combination of basis functions including at least one basis function suitable for representing variation of the process parameter fingerprint between substrates and/or batches of substrates;
receive measurements of the process parameter across at least one substrate;
determine substrate model parameters using the measurements and the basis functions; and
determine a control parameter based on weighted values of the substrate model parameters, wherein values of substrate model parameters associated with the at least one basis function have a reduced weighting.

15. A method comprising:
after a first physical processing step in a lithographic process performed on at least one substrate of a series of substrates, obtaining measurements of a measurement parameter across the at least one substrate;
applying the measurements to a model to determine a full fingerprint estimation of one or more operational parameters across the at least one substrate;
utilizing the full fingerprint estimation for applying the one or more operational parameters at a second physical processing step in the lithographic process of the at least one substrate;
modifying the full fingerprint estimation to account for effects predetermined to have a distorting effect on at least one control parameter, to obtain a control parameter fingerprint estimation for the at least one substrate; and
at the first physical processing step in the lithographic processing of at least one subsequent substrate in the series of substrates, applying the control parameter fingerprint estimation.

16. The method of claim 15, wherein the one or more operational parameters includes the at least one control parameter.

17. The method of claim 15, wherein modifying the full fingerprint estimation to account for effects predetermined to have a distorting effect on the at least one control parameter is based on known fingerprint behavior determined during a control strategy setup phase.

18. The method of claim 15, wherein the one or more operational parameters used in the model are selected by tuning an exponentially weighted moving average filter to provide a half-life decay distance or decay range parameter value for each of the one or more operational parameters.

19. The method of claim 15, wherein the control parameter fingerprint estimation is used to determine a per-context fingerprint related to a specific apparatus employed in the lithographic process.

20. A computer product comprising a non-transitory computer-readable medium having instructions therein, the instructions, when executed by at least one processor, configured to cause the at least one processor to at least:
after a first physical processing step in a lithographic process performed on at least one substrate of a series of substrates, obtain measurements of a measurement parameter across the at least one substrate;

apply the measurements to a model to determine a full fingerprint estimation of one or more operational parameters across the at least one substrate;

utilize the full fingerprint estimation for application of the one or more operational parameters at a second physical processing step in the lithographic process of the at least one substrate;

modify the full fingerprint estimation to account for effects predetermined to have a distorting effect on at least one control parameter, to obtain a control parameter fingerprint estimation for the at least one substrate; and at the first physical processing step in the lithographic processing of at least one subsequent substrate in the series of substrates, apply the control parameter fingerprint estimation.

\* \* \* \* \*